(12) United States Patent
Li et al.

(10) Patent No.: US 12,209,014 B2
(45) Date of Patent: Jan. 28, 2025

(54) METHOD FOR PREPARING A MEMS MICRO MIRROR WITH ELECTRODES ON BOTH SIDES

(71) Applicant: Anhui China Science MW Electronic Technology Co., Ltd., Bengbu (CN)

(72) Inventors: Wei Li, Bengbu (CN); Jing Xu, Bengbu (CN)

(73) Assignee: Anhui China Science MW Electronic Technology Co., Ltd., Bengbu (CN)

( * ) Notice: Subject to any disclaimer, the term of this patent is extended or adjusted under 35 U.S.C. 154(b) by 451 days.

(21) Appl. No.: 17/560,164

(22) Filed: Dec. 22, 2021

(65) Prior Publication Data
US 2022/0371883 A1 Nov. 24, 2022

(30) Foreign Application Priority Data
May 19, 2021 (CN) .......................... 202110547196.6

(51) Int. Cl.
*B81C 1/00* (2006.01)
*G02B 7/182* (2021.01)
*G02B 26/08* (2006.01)

(52) U.S. Cl.
CPC ........ *B81C 1/00166* (2013.01); *G02B 7/1821* (2013.01); *G02B 26/0841* (2013.01)

(58) Field of Classification Search
CPC . B81C 1/0016; B81C 1/00182; G02B 7/1821; G02B 26/0841; B81B 2201/04–047; B81B 2203/0136
See application file for complete search history.

(56) References Cited

U.S. PATENT DOCUMENTS

| | | | |
|---|---|---|---|
| 2002/0159170 A1* | 10/2002 | Tsuboi | B81C 1/00396 359/872 |
| 2009/0109512 A1* | 4/2009 | Park | G02B 26/0833 359/198.1 |
| 2022/0324699 A1* | 10/2022 | Sun | H02N 1/008 |

* cited by examiner

*Primary Examiner* — Laura M Menz
*Assistant Examiner* — Candice Chan
(74) *Attorney, Agent, or Firm* — IPRTOP LLC

(57) ABSTRACT

The present disclosure provides a method for preparing a MEMS micro mirror with electrodes on both sides. The method includes: providing a first base, forming an electrode lead groove in the first base; forming an insulating groove, a plurality of lower comb plates and a moving space groove in a first device layer to obtain a bonded structure layer; providing a second base bonded with the bonded structure layer to obtain a bonded piece; forming a frame, upper comb plates, movable micro light reflector, and elastic beams in a second device layer, with the movable micro light reflector located inside the frame, and the elastic beam connected with the frame and/or the movable micro light reflector; forming a metal reflecting layer, a first upper comb plate electrode, a first lower comb plate electrode, a second upper comb plate electrode and a second lower comb plate electrode.

10 Claims, 11 Drawing Sheets providing a first base, wherein the first base comprises a first lower protective layer, a first substrate, a first insulating layer, a first device layer, and a first upper protective layer sequentially stacked; forming an electrode lead groove in the first base, wherein the electrode lead groove extends from the first lower protective layer to a surface of the first device layer;

↓ removing the first upper protective layer;

↓ in the first device layer, forming an insulating groove, a plurality of lower comb plates, and a moving space groove to obtain a bonded structure layer, wherein the moving space groove is between the plurality of lower comb plates, and the insulating groove penetrates the first device layer;

↓ providing a second base, comprising a second device layer, a second insulating layer, and a second substrate layer sequentially stacked, wherein the second base is bonded to the bonded structure layer to obtain bonded piece, wherein a surface of the second device layer and a surface of the first device layer are bonding surfaces;

↓ removing the second substrate layer and the second insulating layer; in the second device layer forming a frame, a plurality of upper comb plates, a movable micro light reflector, and an elastic beam, wherein the movable micro light reflector is located inside the frame, the elastic beam is connected to the frame and/or the movable micro light reflector, wherein the movable micro light reflector is located above the moving space groove, wherein projections of the upper comb plates and the lower comb plates on a horizontal plane are staggered;

↓ forming a metal reflective layer, a first upper comb plate electrode, a first lower comb plate electrode, a second upper comb plate electrode, and a second lower comb plate electrode, wherein the first upper comb plate electrode and the first lower comb plate electrode are located on a surface of the frame, and the second upper comb plate electrode and the second lower comb plate electrode extend from the electrode lead groove to the surface of the first substrate, wherein the first lower comb plate electrode and the second lower comb plate electrode are electrically connected to the lower comb plates, and the first upper comb plate electrode and the second upper comb plate electrode are electrically connected to the upper comb plates.

Fig. 1

METHOD FOR PREPARING A MEMS MICRO MIRROR WITH ELECTRODES ON BOTH SIDES

CROSS REFERENCE TO RELATED APPLICATION

This application claims the benefits of priority to Chinese Patent Application No. CN 2021105471966, entitled "Method for Preparing a MEMS Micro Mirror with Electrodes on Both Sides", filed with CNIPA on May 19, 2021, the contents of which are incorporated herein by reference in its entirety.

BACKGROUND

Field of Disclosure

The present invention relates to micro electromechanical systems (MEMS), particularly to a method for preparing a MEMS micro mirror with electrodes on both sides.

Description of Related Arts

With the maturing of MEMS technology, MEMS micro mirrors and micro mirror arrays (i.e. structures containing multiple micro mirrors) are being applied in an ever increasing number of scenarios, such as in optical communication devices, digital displays, laser scanning and so on. Electrostatic MEMS micro mirrors and micro mirror arrays have received attention due to their compact structures, low power consumption, and easy integration.

At present, regarding the application of MEMS micro mirrors and micro mirror arrays, there are mainly two electrode lead-out methods. One is to lead from the upper surface of the device, and the other is from the lower surface of the device. Electrodes of a conventional MEMS micro mirror are fabricated on the upper surface of the device, electrically connected to an external electrode through wire bonding; electrodes of a conventional micro mirror array are fabricated on the lower surface of the device, electrically connected to an external electrode through eutectic bonding.

Electrostatic MEMS micro mirror and micro mirror array have a wide range of demand, which necessitates a higher requirement for their performance and testing, and particularly micro mirror rotational angle-voltage testing is usually required for each chip. Accurate testing of micro mirror rotational angles typically adopts a high-precision optical test system achieved by optical feedback from a micro light reflector. For a conventional micro mirror array, its reflectors and electrodes are located on the upper and lower surfaces of the device, respectively, and it is necessary to apply a certain voltage to the lower surface of the device for testing the micro mirror array, which hinders automation of wafer-level micro mirror array testing.

Therefore, how to further improve the flexibility of MEMS micro mirror and micro mirror arrays, and to overcome the above mentioned shortcomings is an urgent problem waiting to be solved.

SUMMARY

The present disclosure provides a method for preparing a MEMS micro mirror with electrodes on both sides, which solves problems of conventional MEMES micro mirror and micro mirror arrays that they are difficult to be tested, packaged, and applied.

The method includes:
providing a first base, wherein the first base comprises a first lower protective layer, a first substrate, a first insulating layer, a first device layer, and a first upper protective layer sequentially stacked; forming an electrode lead groove in the first base, wherein the electrode lead groove extends from the first lower protective layer to a surface of the first device layer;
removing the first upper protective layer;
in the first device layer, forming an insulating groove, a plurality of lower comb plates, and a moving space groove to obtain a bonded structure layer, wherein the moving space groove is between the plurality of lower comb plates, and the insulating groove penetrates the first device layer;
providing a second base, comprising a second device layer, a second insulating layer, and a second substrate sequentially stacked, wherein the second base is bonded to the bonded structure layer to obtain a bonded piece, wherein a surface of the second device layer and a surface of the first device layer are bonding surfaces;
removing the second substrate layer and the second insulating layer; in the second device layer forming a frame, a plurality of upper comb plates, a movable micro light reflector, and an elastic beam, wherein the movable micro light reflector is located inside the frame, the elastic beam is connected to the frame and/or the movable micro light reflector, wherein the movable micro light reflector is located above the moving space groove, wherein projections of the upper comb plates and the lower comb plates on a horizontal plane are staggered;
forming a metal reflective layer, a first upper comb plate electrode, a first lower comb plate electrode, a second upper comb plate electrode, and a second lower comb plate electrode, wherein the first upper comb plate electrode and the first lower comb plate electrode are located on a surface of the frame, and the second upper comb plate electrode and the second lower comb plate electrode extend from the electrode lead groove to the surface of the first substrate, wherein the first lower comb plate electrode and the second lower comb plate electrode are electrically connected to the lower comb plates, and the first upper comb plate electrode and the second upper comb plate electrode are electrically connected to the upper comb plates.

Alternatively, the first base and the second base both include a silicon-on-insulator (SOI) substrate.

In one embodiment, a cross section of the electrode lead groove is a trapezoid, and the forming of the electrode lead groove comprises: etching the first lower protective layer and the first substrate to form a first opening, and then removing the first insulating layer corresponding to the first opening to form the electrode lead groove exposing the first device layer.

In one embodiment, a cross section of the electrode lead groove is a rectangle, and the forming of the electrode lead groove comprises removing the first lower protective layer and the first upper protective layer, and then etching the first substrate and the first insulating layer in one etching process, to form the electrode lead groove exposing the first device layer, wherein during the forming of the electrode lead groove, the insulating groove penetrating the first substrate is formed in the first substrate.

The present disclosure also provides another method for preparing a MEMS micro mirror with electrodes on both sides, including the following steps:

providing a first base, wherein the first base comprises a first lower protective layer, a first substrate, a first insulating layer, a first device layer, and a first upper protective layer sequentially stacked; in the first base, forming a lower lead groove which extends from the first lower protective layer to a surface of the first device layer;

removing the first upper protective layer;

in the first device layer, forming an insulating groove, a plurality of lower comb plates, an upper lead groove, and a moving space groove to obtain a bonded structure layer, wherein the moving space groove is between the plurality of lower comb plates, the upper lead groove and the insulating groove penetrate the first device layer, and the upper lead groove and the lower lead groove are connected and form an electrode lead groove;

providing a third base, wherein the third base comprises a third lower protective layer, a third device layer, a third insulating layer, a third substrate layer, and a third upper protective layer sequentially stacked, wherein the third base and the bonded structure layer is bonded to obtain a bonded piece, wherein a surface of the third lower protective layer of the third base and a surface of the first device layer are bonding surfaces;

removing the third upper protective layer, the third substrate layer, and the third insulating layer, forming a frame, upper comb plates, a movable micro light reflector, elastic beams and a lower comb plate electrode lead groove in the third device layer, wherein the movable micro light reflector is located inside the frame, the elastic beams are connected to the frame and/or the movable micro light reflector, the movable micro light reflector is above the moving space groove, the lower comb plate electrode lead groove penetrates the third device layer and extends down to a surface of the first device layer, and projections of the upper comb plates and the lower comb plates on a horizontal plane are staggered;

forming a metal reflective layer, a first upper comb plate electrode, a first lower comb plate electrode, a second upper comb plate electrode, and a second lower comb plate electrode, wherein the first upper comb plate electrode is located on a surface of the frame, and the first lower comb plate electrode is located inside the lower comb plates electrode lead groove, wherein the second upper comb plate electrode and the second lower comb plate electrode extend from the electrode lead groove to a surface of the first substrate, wherein the first lower comb plate electrode and the second lower comb plate electrode are electrically connected with the lower comb plates, and the first upper comb plate electrode and the second upper comb plate electrode are electrically connected with the upper comb plates.

The present disclosure further provides another method for preparing a MEMS micro mirror with electrodes on both sides, including the following steps:

providing a fourth base, and forming isolation grooves in the fourth base, with the isolation grooves extending along a longitudinal direction of the fourth base;

forming an insulating groove, a moving space groove, and a plurality of lower comb plates on a side of the fourth base away from the isolation grooves to obtain a pretreatment structure, and the insulating groove, the moving space groove, and the plurality of lower comb plates all extend along the longitudinal direction of the fourth base, wherein the insulating groove and/or the moving space groove are connected with the isolation grooves;

providing a fifth base, wherein the fifth base comprises a fifth device layer, a fifth insulating layer, and a fifth substrate layer sequentially stacked, the fifth base and the pretreatment structure are bonded together, and an opening surface of the moving space groove and a surface of the fifth device layer are bonding surfaces;

removing the fifth substrate layer and the fifth insulating layer;

in the fifth device layer, forming a frame, a plurality of upper comb plates, a movable micro light reflector, and an elastic beam, wherein the movable micro light reflector is located inside the frame, the elastic beam is connected to the frame and/or the movable micro light reflector, wherein the movable micro light reflector is located above the moving space groove, wherein projections of the upper comb plates and the lower comb plates on a horizontal plane are staggered;

forming a metal reflective layer, a first upper comb plate electrode, a second upper comb plate electrode, a first lower comb plate electrode, and a second lower comb plate electrode, wherein the metal reflective layer is located on a surface of the movable micro light reflector, the first upper comb plate electrode and the first lower comb plate electrode are located on a surface of the fifth device layer, and the second upper comb plate electrode and the second lower comb plate electrode are located on a surface of the fourth base away from the fifth device layer, wherein the first lower comb plate electrode and the second lower comb plate electrode are electrically connected with the lower comb plates, and the first upper comb plate electrode and the second upper comb plate electrode are electrically connected with the upper comb plates.

Optionally, there are multiple MEMS micro mirrors, and adjacent MEMS micro mirrors are electrically insulated by the isolation grooves.

Optionally, the forming of the isolation grooves comprises: first forming a plurality of isolation openings in the fourth base, and filling insulating material in the isolation openings to form the isolation grooves.

The present disclosure further provides another method for preparing a MEMS micro mirror with electrodes on both sides, including the following steps:

providing a fourth base, and forming isolation grooves in the fourth base, with the isolation grooves extending along a longitudinal direction of the fourth base;

forming an insulating groove, a moving space groove, and a plurality of lower comb plates on a side of the fourth base away from the isolation grooves to obtain a pretreatment structure, and the insulating groove, the moving space groove, and the plurality of lower comb plates all extend along the longitudinal direction of the fourth base, wherein the insulating groove and/or the moving space groove are connected with the isolation grooves;

providing a sixth base, wherein the sixth base comprises a sixth lower protective layer, a sixth device layer, a sixth insulating layer, a sixth substrate layer, and a sixth upper protective layer sequentially stacked, wherein the sixth base and the pretreatment structure are bonded, wherein an opening surface of the moving space groove and a surface of the sixth lower protective layer are bonding surfaces;

removing the sixth upper protective layer, the sixth substrate layer, and the sixth insulating layer until the sixth device layer is exposed;

forming a frame, upper comb plates, a movable micro light reflector, elastic beams, a first upper comb plate electrode lead groove and a first lower comb plate electrode lead groove in the sixth device layer, wherein the movable micro light reflector is located inside the frame, the elastic beams are connected with the frame and/or the movable micro light reflector, and the movable micro light reflector is located above the moving space groove, wherein projections of the upper comb plates and the lower comb plates on a horizontal plane are staggered, wherein the first upper comb plate electrode lead groove and the first lower comb plate electrode lead groove extend along a longitudinal direction of the sixth device layer to a surface of the fourth base;

forming a metal reflective layer, a first upper comb plate electrode, a first lower comb plate electrode, a second upper comb plate electrode, and a second lower comb plate electrode, wherein the metal reflective layer is located on a surface of the movable micro light reflector, wherein the first upper comb plate electrode extends from the first upper comb plate electrode lead groove to a surface of the sixth device layer, and the first lower comb plate electrode is located in the first lower comb plate electrode lead groove, wherein the second upper comb plate electrode and the second lower comb plate electrode are located on a surface of the fourth base away from the moving space groove, wherein the first lower comb plate electrode and the second lower comb plate electrode are electrically connected to the lower comb plates, and the first upper comb plate electrode and the second upper comb plate electrode are electrically connected to the upper comb plates.

Optionally, the first upper comb plate electrode extends from the first upper comb plate electrode lead groove to a surface of the sixth device layer.

As mentioned above, the method for preparing a MEMS micro mirror with electrodes on both sides of the present disclosure has the following beneficial effects: the MEMS micro mirror is provided with electrodes on its upper and lower sides, and probes and test systems can be easily built on the chip during testing. Therefore, conventional testing methods can be utilized without customized test equipment. The electrodes can still be led out from the lower side during packaging, which can greatly improve the test and packaging flexibility of the chip.

BRIEF DESCRIPTION OF THE DRAWINGS

FIG. 1 shows a flow chart of a method for preparing a MEMS micro mirror with electrodes on both sides according to Embodiment 1 of the present disclosure.

REFERENCE NUMERALS

Figure 2:
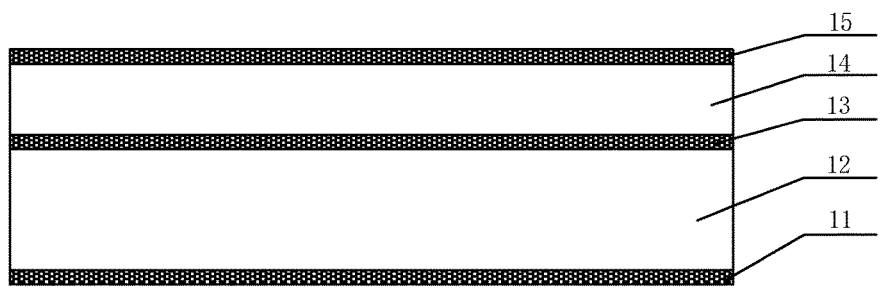
FIGS. 2 to 9 show exemplary cross-sectional views of intermediate structures of a MEMS micro mirror with electrodes on both sides prepared according to the method shown in FIG. 1.

11—first lower protective layer;
12—first substrate;
13—first insulating layer;
14—first device layer;
15—first upper protective layer;
16—electrode lead groove;
17—insulating groove;
18—lower comb plates;
19—moving space groove;
20—second device layer;
21—second insulating layer;
22—second substrate layer;
23—frame;
231—inner frame;
232—outer frame;
24—upper comb plates;
25—movable micro light reflector;
26—elastic beam;
27—metal reflective layer;
28—first upper comb plate electrode;
29—first lower comb plate electrode;
30—second upper comb plate electrode;
31—second lower comb plate electrode;
32—third lower protective layer;
33—third device layer;
34—third insulating layer;
35—third substrate layer;
36—third upper protective layer;
37—lower comb plate electrode lead groove;
38—fourth base;
39—isolation groove;
40—fifth device layer;
41—fifth insulating layer;
42—fifth substrate layer;
43—sixth lower protective layer;
44—sixth device layer;
45—sixth insulating layer;
46—sixth substrate layer;
48—sixth upper protective layer.

DETAILED DESCRIPTION

The following describes the implementation of the present disclosure through specific examples, and those skilled in the art can easily understand other advantages and effects of the present disclosure from the content disclosed in this specification.

Please refer to FIG. 1~FIG. 29. It should be noted that the structure, ratio, size, etc. shown in the accompanying drawings in this specification are only used to illustrate the content disclosed in the specification for the understanding and reading of those familiar with this technology, and are not intended to limit the implementation of the present invention. Any structural modification, proportional relationship change or size adjustment should still fall within the scope of the present disclosure, given that no effect and objective achievable by the present disclosure are hindered. Terms such as "upper", "lower", "left", "right", "middle", "first" and "second" used in this specification are only for ease of description, and they are not intended to limit the scope of implementation of the present invention. Any change or adjustment of corresponding relative relationships without any substantial technical change should be regarded as within the scope of the implementation of the present disclosure.

In a conventional electrostatic MEMS micro mirror array, its electrodes and reflectors are generally located on the upper and lower side of the array. Because the micro mirror array usually has a large area and the number of the electrodes is also large, if the electrodes are led out from the upper surface of the array, the device's performance will be impacted. So the electrodes are generally located on the lower surface of the device, and therefore the electrodes are usually led out from the lower surface during testing. However, this means, probes for wafer-level testing can only be located under the chip, which can't be achieved by existing testing equipment on the market, and during the testing a given voltage also needs to be applied to the lower surface of the device, which brings difficulties to the testing of the micro mirror array.

Embodiment 1

Figure 3:
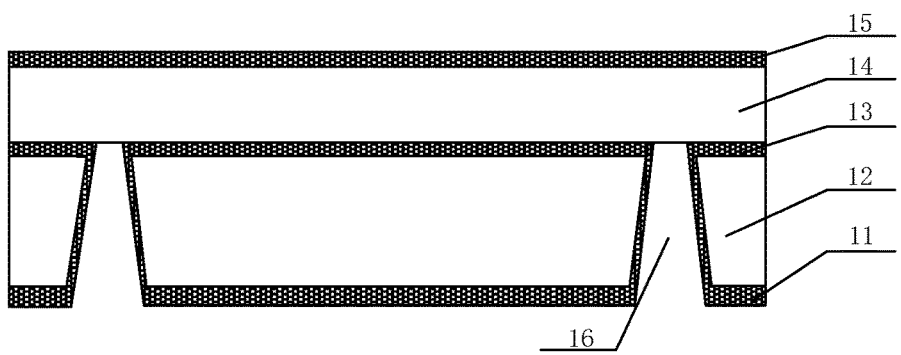
Figure 6:
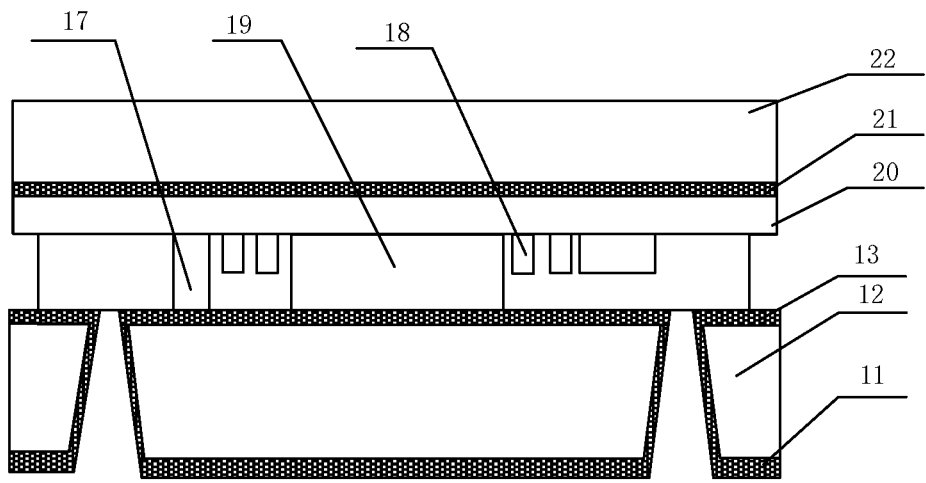
Figure 7:
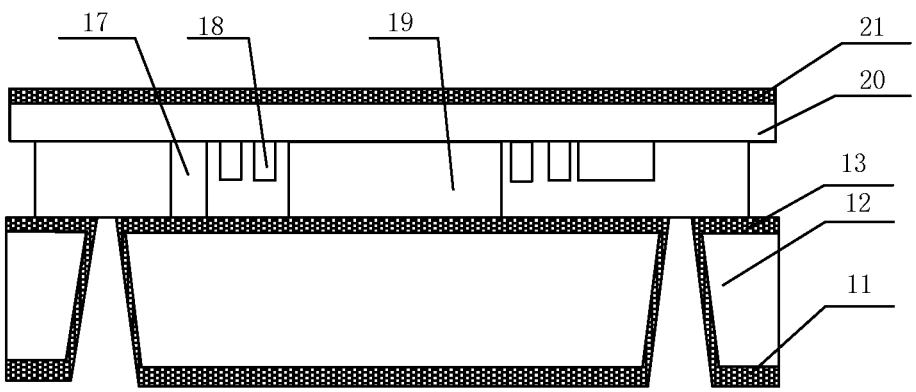
Figure 8:
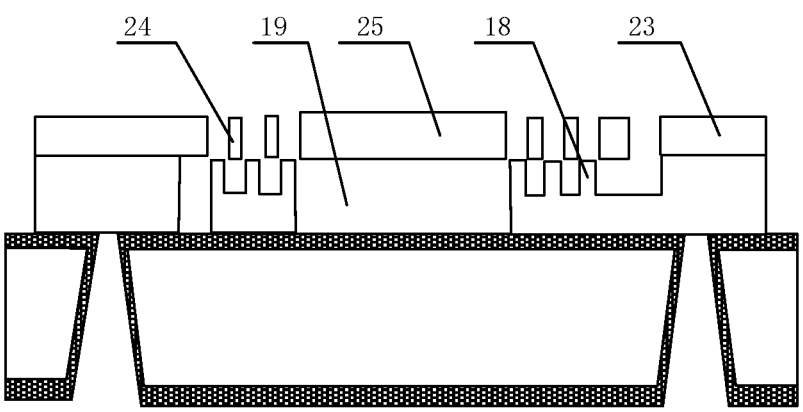
Figure 9:
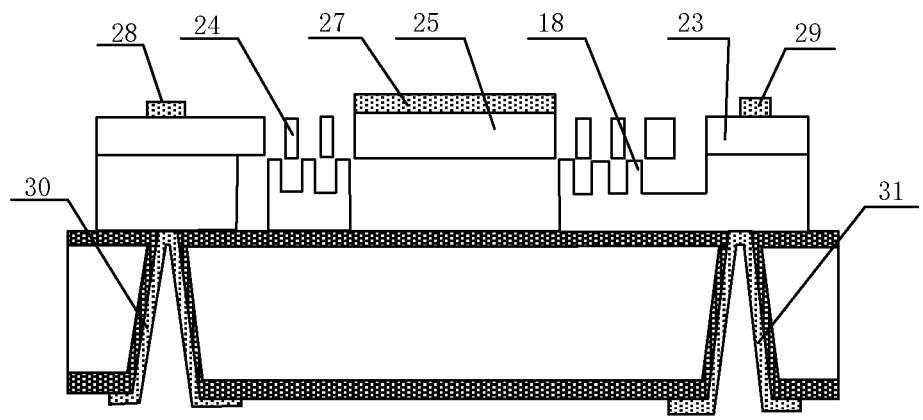

As shown in FIG. 1, this embodiment provides a method for preparing a MEMS micro mirror with electrodes on both sides, which includes the following steps:
  providing a first base, whose structure is shown in FIG. 2, which includes a first lower protective layer 11, a first substrate 12, a first insulating layer 13, a first device layer 14, and a first upper protective layer 15 sequentially stacked; forming an electrode lead groove 16 in the first base using a method such as photo lithographing etching, with the electrode lead groove 16 extending from the first lower protective layer 11 to a surface of the first device layer 14, resulting in the structure as shown in FIG. 3; In one embodiment, a cross section of the electrode lead groove 16 is a trapezoid, which means its opening area gradually decreases upwards from the first lower protective layer 11; and the forming of the electrode lead groove 16 comprises: etching the first lower protective layer 11 and the first substrate 12 to form a first opening, and then removing the first insulating layer 13 corresponding to the first opening to form the electrode lead groove 16 exposing the first device layer 14;
  removing the first upper protective layer 15 by methods including but not limited to etching so as to expose the first device layer 14;
  in the first device layer 14, forming an insulating groove 17, a plurality of lower comb plates 18 that are spaced apart from each other, and a moving space groove 19 to obtain a bonded structure layer by methods including but not limited to photo lithographing etching, wherein the moving space groove 19 is between the plurality of lower comb plates 18, the insulating groove 17 is inside or outside the moving space groove 19, and the insulating groove 17 penetrates the first device layer 14; specifically, openings corresponding to the moving space groove 19 and the insulating groove 17 are formed in the first device layer 14 by photo lithographic etching, to obtain the structure shown in FIG. 4, then the openings are further etched to obtain the insulating groove 17, the lower comb plates 18 and the moving space groove 19, to obtain the structure shown in FIG. 5; dividing the etching process into several steps helps to ensure the graphic quality of the etching; the moving space groove 19 provides moving space for comb plates and a movable micro light reflector 25.
  providing a second base, which includes a second device layer 20, a second insulating layer 21, and a second substrate layer 22 sequentially stacked, wherein the second base is bonded to the bonded structure layer to obtain a bonded piece wherein a surface of the second device layer 20 and a surface of the first device layer 14 are bonding surfaces, as shown in FIG. 6;
  removing the second substrate layer 22, with the resulting structure shown in FIG. 7, and then removing the second insulating layer 21 until the second device layer 20 is exposed; in the second device layer 20, forming a frame 23, a plurality of upper comb plates 24 that are spaced apart from each other, a movable micro light reflector 25, and an elastic beam 26 by methods including but not limited to photo lithographing etching, wherein the movable micro light reflector 25 is located inside the frame 23, the elastic beam 26 is connected to the frame 23 and/or the movable micro light reflector 25 (in the Specification, "connected" means "directly connected" and/or "indirectly connected"); the movable micro light reflector 25 is located above the moving space groove 19; the projections of the upper comb plates 24 and the lower comb plates 18 on a horizontal plane are staggered, and the numbers of the upper comb plates 24 and the lower comb plates 18 are both more than one, such as three or more, in order to form multiple comb plates pairs; the widths of the upper comb plates 24 and the lower comb plates 18 may be the same or different; the resulting structure is shown in FIG. 8;
  forming a metal reflective layer 27, a first upper comb plate electrode 28, a first lower comb plate electrode 29, a second upper comb plate electrode 30, and a second lower comb plate electrode 31 using methods including but not limited to sputtering, wherein the first upper comb plate electrode 28 and the first lower comb plate electrode 29 are located on a surface of the frame 23, and the second upper comb plate electrode 30 and the second lower comb plate electrode 31 extend from the electrode lead groove 16 to a surface of the first substrate, wherein the first lower comb plate electrode 29 and the second lower comb plate electrode 31 are electrically connected to the lower comb plates 18, and the first upper comb plate electrode 28 and the second upper comb plate electrode 30 are electrically connected to the upper comb plates 24, and the resulting structure is shown in FIG. 9; the materials of the metal reflective layer 27 and the electrodes include one or more of gold, silver, copper, and aluminum.

In the present disclosure, electrodes are arranged on the upper and lower sides of the MEMS micro mirror, and the probe and test system can be easily built on the chip during testing. Therefore, conventional test methods can be used without customized test equipment since the electrodes can still be led out from below when packaged, which can greatly improve testing and packaging flexibility of the chip.

Figure 10:
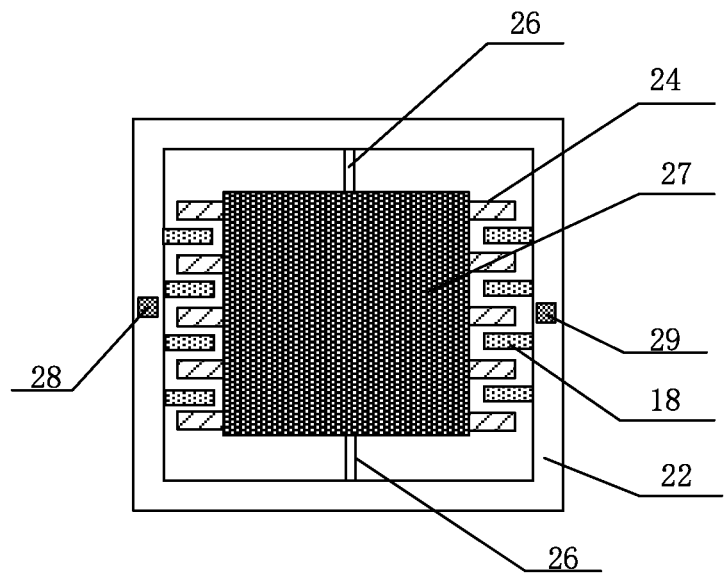
FIGS. 10 and 11 show top views of a MEMS micro mirror with electrodes on both sides prepared according to the method shown in FIG. 1 as applied in different embodiments.

In an embodiment, as shown in FIG. 10, there are two elastic beams 26 (defined as a first elastic beam and a second elastic beam), the frame 23 is a single frame 23, and the first elastic beam and the second elastic beam are located inside the frame 23, and connect the frame 23 and the movable micro light reflector 25 along a first direction. The structure of this embodiment is relatively simple, but the movable micro light reflector 25 can only rotate in one direction. In order to improve the stability of the overall structure and the performance of the device, the size and shape of the two elastic beams 26 are preferably the same.

Figure 11:
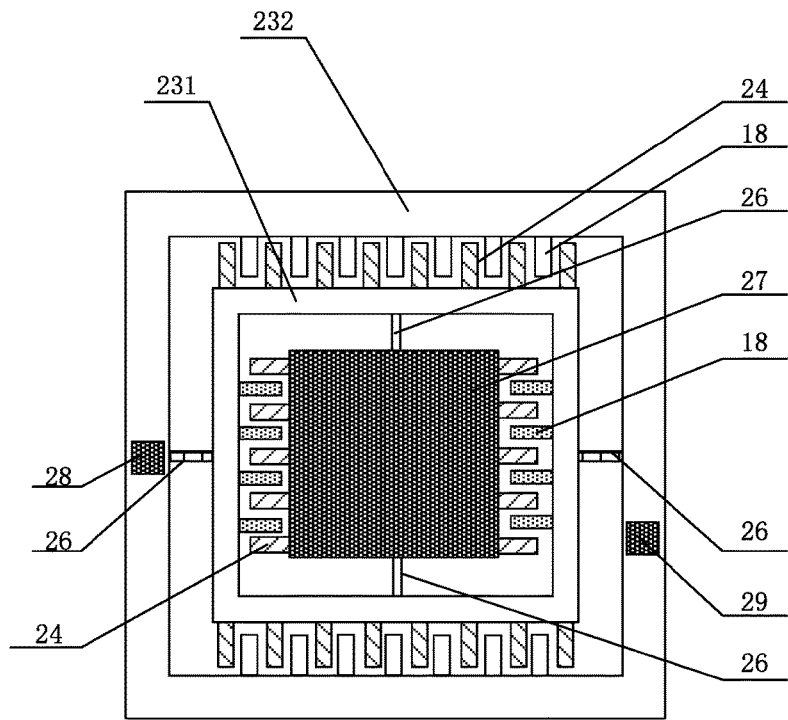

In another embodiment, as shown in FIG. 11, the frame 23 includes an inner frame 231 and an outer frame 232 located at the periphery of the inner frame 231, and the movable micro light reflector 25 is located in the inner frame 231; the elastic beams 26 further include a third elastic beam and a fourth elastic beam. The third elastic beam and the fourth elastic beam are located between the inner frame 231 and the outer frame 232, and connect the inner frame 231 and the outer frame 232 along a second direction with the second direction perpendicular to the first direction. In this embodiment, the movable micro light reflector 25 can be driven to rotate in two directions perpendicular to each other.

In order to further improve the performance of the device, as an example, the first elastic beam and the second elastic beam have the same shape and size; the third elastic beam and the fourth elastic beam have the same shape and size; and the elastic beams 26 are distributed symmetrically with movable micro light reflector 25 as the center.

As an example, both the first base and the second base include a silicon-on-insulator (SOI) substrate, that is, the first device layer 14, the first substrate 12, and the second device layer 20 may be silicon material layers; the first lower protective layer 11, the second lower protective layer, the first insulating layer 13, and the second insulating layer 21 may be silicon oxide layers; each protective layer provides protection for a corresponding device layer. Of course, in other examples, each device layer and substrate can also be made of semiconductor materials such as germanium, silicon germanium, silicon carbide, etc. The first lower protective layer 11, the second lower protective layer, the first insulating layer 13, and the second insulating layer 21 can also be made of other insulating material accordingly, and the second substrate layer 22 can be made of insulating materials such as glass, ceramics, semiconductor materials such as silicon, or a combination thereof.

Figure 12:
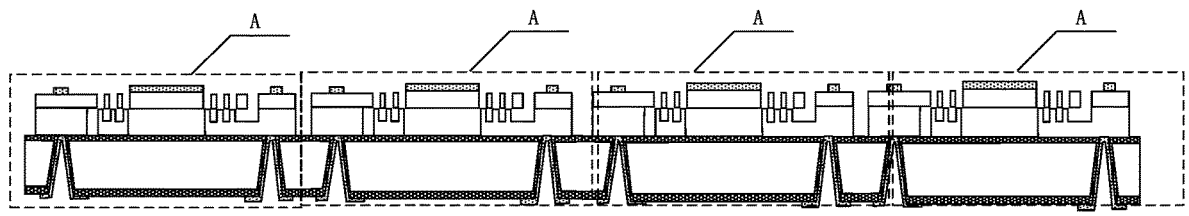
FIG. 12 shows a cross-sectional view of a plurality of MEMS micro mirrors with electrodes on both sides prepared according to the method shown in FIG. 1 when they are arranged in an array.

The preparation method provided in this embodiment can be used to prepare a single MEMS micro mirror, and can also be used to prepare a MEMS micro mirror array, that is, to manufacture multiple MEMS micro mirrors at the same time, for example, to manufacture hundreds of or thousands of MEMS micro mirrors on a wafer at the same time. Especially when the method is used to make MEMS micro mirror arrays, its advantages are particularly prominent. For example, FIG. 12 shows a schematic diagram of the structure of a MEMS micro mirror array prepared by the method of this embodiment. Each micro mirror of the MEMS micro mirror array is as shown in FIG. 9. In other words, FIG. 9, in a sense, is an enlarged view of area A of FIG. 12.

It should be noted that the enumeration of above steps is only intended to describe the method of the present disclosure in more detail, and is not used to limit the order the steps can be carried out. In fact, the order of the steps can be adjusted, and some of the steps can be combined as needed. For example, when forming the insulating groove, the plurality of lower comb plates, and the moving space groove in the first device layer, each structure can be formed at the same time or successively.

Embodiment 2

Figure 13:
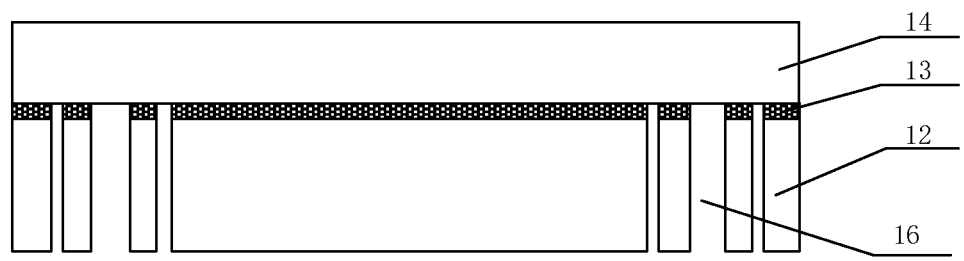
FIGS. 13 and 14 show exemplary cross-sectional views of intermediate structures of a MEMS micro mirror with electrodes on both sides prepared according to the method provided in Embodiment 2 of the present disclosure.

This embodiment provides another method for preparing a MEMS micro mirror with electrodes on both sides. The main difference between this embodiment and Embodiment 1 is that, in Embodiment 1, there are several etching steps during the process of preparing the electrode lead groove 16: the first lower protective layer 11 and the first substrate 12 are etched to form a first opening, and then the first insulating layer 13 corresponding to the first opening is removed to form the electrode lead groove 16 exposing the first device layer 14; in Embodiment 2, when the first lower protective layer 11 and the first upper protective layer 15 are removed (or it may be provided that only includes the second device layer 20, the second insulating layer 21, and the second substrate layer 22), the first substrate 12 and the first insulating layer 13 are then etched in the same etching step to form the electrode lead groove 16 exposing the first device layer 14, during which an insulating groove 17 penetrating the first substrate 12 is formed in the first substrate 12, and the resulting structure is shown in FIG. 13. As an example, a cross section of the electrode lead groove 16 in this embodiment is a rectangle.

Figure 14:
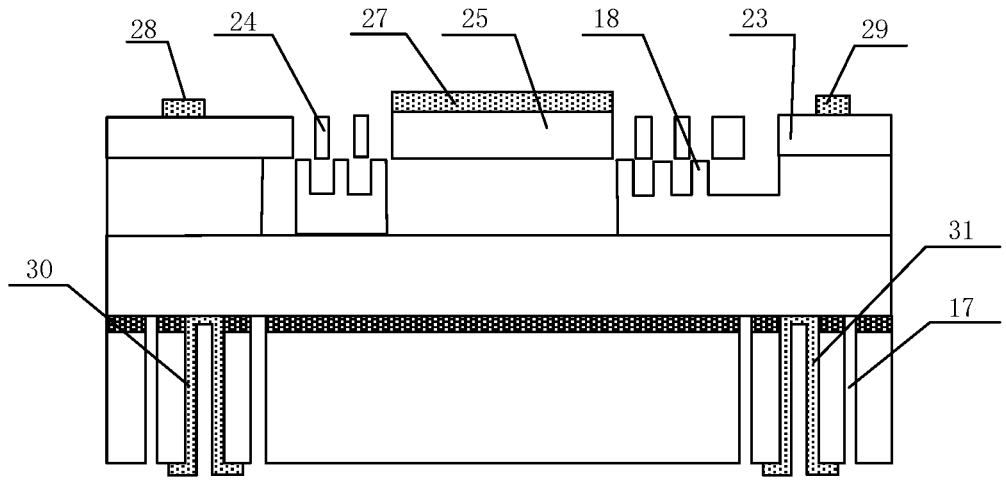

Except for the above differences, the other steps of the method, the material of each layer, and the processing technology of this embodiment are basically the same as those in Embodiment 1. For details, please refer to the content regarding Embodiment 1. The final structure of the MEMS micro mirror with electrodes on both sides prepared according to the method of this embodiment is shown in FIG. 14. This embodiment can also be used to prepare a MEMS micro mirror array.

Embodiment 3

Figure 4:
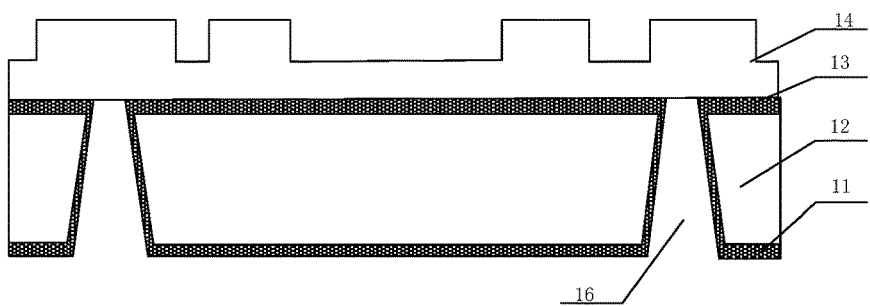
Figure 5:
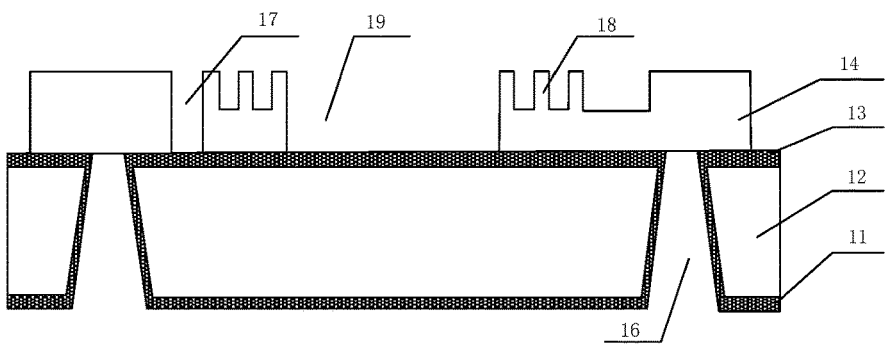
Figure 15:
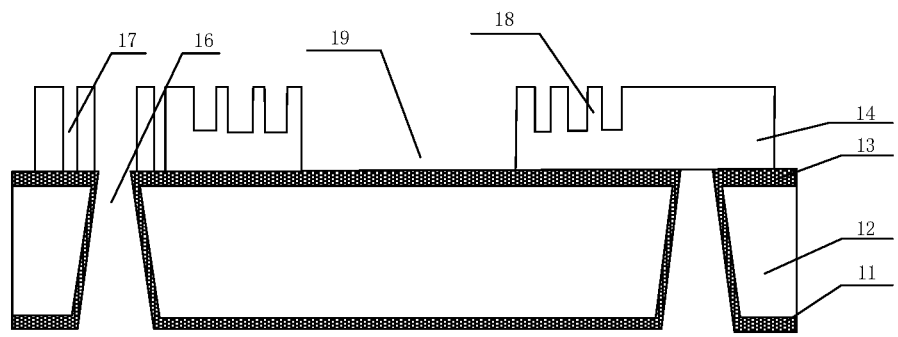
FIGS. 15 to 18 show exemplary cross-sectional views of intermediate structures of a MEMS micro mirror with electrodes on both sides prepared according to the method provided in Embodiment 3 of the present disclosure.
Figure 16:
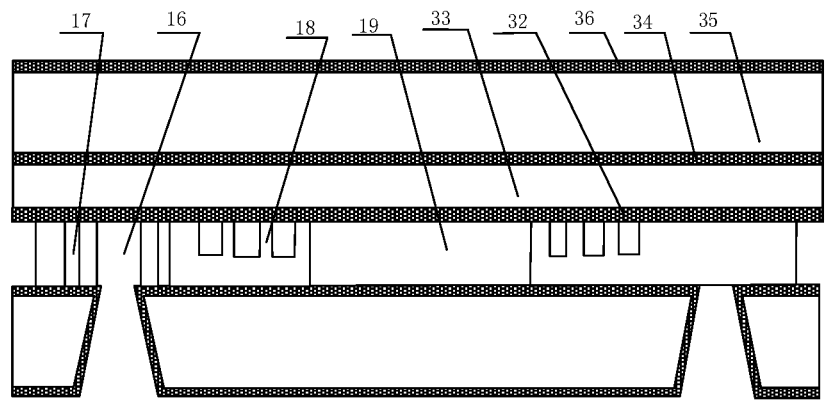
Figure 17:
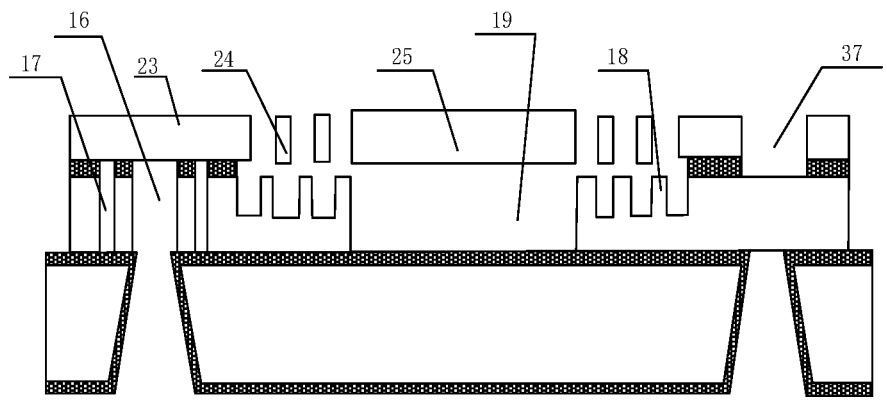
Figure 18:
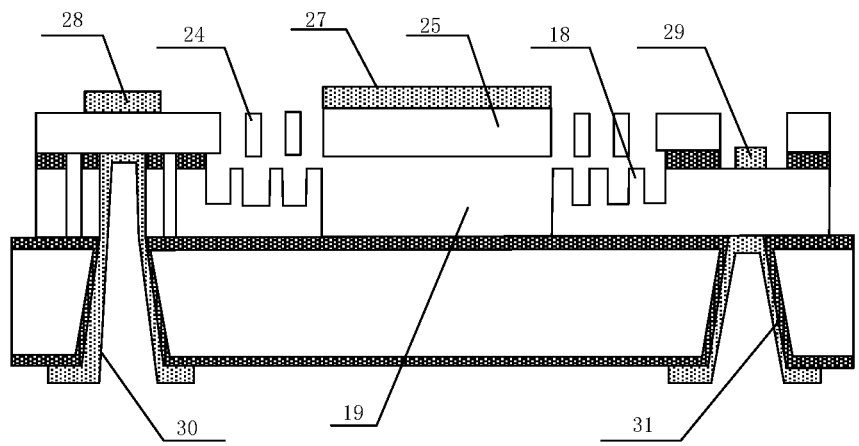

This embodiment provides another method for preparing a MEMS micro mirror with electrodes on both sides. The main difference between the method of this embodiment and Embodiment 1 is that, in this embodiment, while forming an insulating groove 17, a plurality of lower comb plates 18 that are spaced away from each other, and a moving space groove 19 in a first device layer 14, an upper lead groove is also formed in the first device layer 14 to form an electrode lead groove 16, together with a lower lead groove formed in the first base; bonding surfaces during a subsequent bonding process are a surface of the first device layer 14 and a surface of an insulating layer (in Embodiment 1, the surfaces of the two device layers are the bonding surfaces). Specifically, the method of this embodiment includes the following steps:

providing a first base, wherein the first base comprises a first lower protective layer 11, a first substrate 12, a first insulating layer 13, a first device layer 14, and a first upper protective layer 15 sequentially stacked; in the first base, forming a lower lead groove which extends from the first lower protective layer 11 to a surface of the first device layer 14 (see FIGS. 3-4);

removing the first upper protective layer 15;

forming an insulating groove 17, a plurality of lower comb plates 18, an upper lead groove, and a moving space groove 19 in the first device layer 14 to obtain a bonded structure layer, wherein the moving space groove 19 is between the plurality of lower comb plates 18, the insulating groove 17 and the upper lead groove may be located outside the moving space groove 19 (preferably, the insulating groove 17 is also located outside the upper lead groove, with the inside referring to the side close to the center of the corresponding layer), so that the upper lead groove and the insulating groove 17 penetrate the first device layer 14, and the upper lead groove and the lower lead groove are connected head to tail to form an electrode lead groove 16 (the resulting structure is shown in FIG. 15);

providing a third base, wherein the third base comprises a third lower protective layer 32, a third device layer 33, a third insulating layer 34, a third substrate layer 35, and a third upper protective layer 36 sequentially stacked, wherein the third base and the bonded structure layer are bonded to obtain a bonded piece, wherein a surface of the third lower protective layer 32 of the third base and a surface of the first device layer 14 are bonding surfaces; the third base may include a silicon-on-insulator (SOI) substrate, that is, the third lower protective layer 32, the third insulating layer 34, and the third upper protective layer 36 may be made of silicon oxide, and the third device layer 33 may be made of silicon.

removing the third upper protective layer 36, the third substrate layer 35, and the third insulating layer 34, forming a frame 23, upper comb plates 24, a movable micro light reflector 25, an elastic beam 26 and a lower comb plate electrode lead groove 37 in the third device layer 33, wherein the movable micro light reflector 25 is located inside the frame 23, the elastic beam 26 is connected to the frame 23 and/or the movable micro light reflector 25, the movable micro light reflector 25 is above the moving space groove 19, the lower comb plate electrode lead groove 37 penetrates the third device layer 33 and extends down to a surface of the first device layer 14, and projections of the upper comb plates 24 and the lower comb plates 18 on a horizontal plane are staggered; the resulting structure is shown in FIG. 17 (the third upper protective layer 36 on a surface of the lower comb plates 18 needs to be removed);

forming a metal reflective layer 27, a first upper comb plate electrode 28, a first lower comb plate electrode 29, a second upper comb plate electrode 30, and a second lower comb plate electrode 31, wherein the first upper comb plate electrode 28 is located on a surface of the frame 23, and the first lower comb plate electrode 29 is located inside the lower comb plates electrode lead groove 37, wherein the second upper comb plate electrode 30 and the second lower comb plate electrode 31 extend from the electrode lead groove 16 to a surface of the first substrate 12, wherein the first lower comb plate electrode 29 and the second lower comb plate electrode 31 are electrically connected with the lower comb plates 18, and the first upper comb plate electrode 28 and the second upper comb plate electrode 30 are electrically connected with the upper comb plates 24 (the resulting structure is shown in FIG. 18).

The method of this embodiment can be used to prepare a single MEMS micro mirror or multiple MEMS micro mirrors. When it is used to prepare multiple MEMS micro mirrors, that is, to prepare a MEMS micro mirror array, its advantages are particularly prominent.

Embodiment 4

Figure 19:
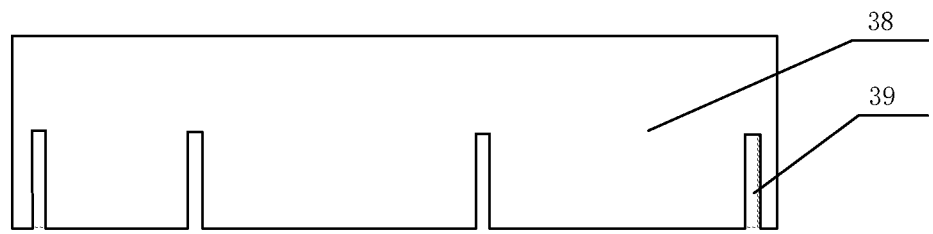
FIGS. 19-27 show exemplary cross-sectional views of intermediate structures of a MEMS micro mirror with electrodes on both sides prepared according to the method provided in Embodiment 4 of the present disclosure.
Figure 20:
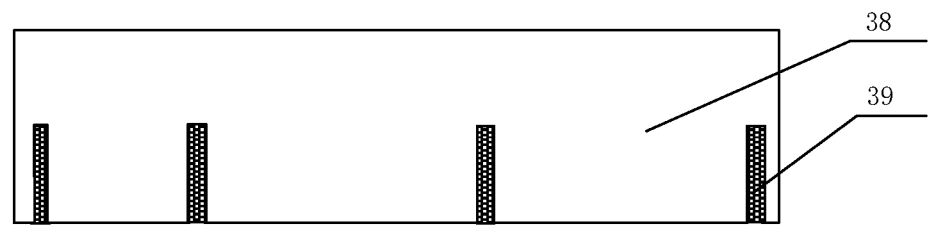
Figure 21:
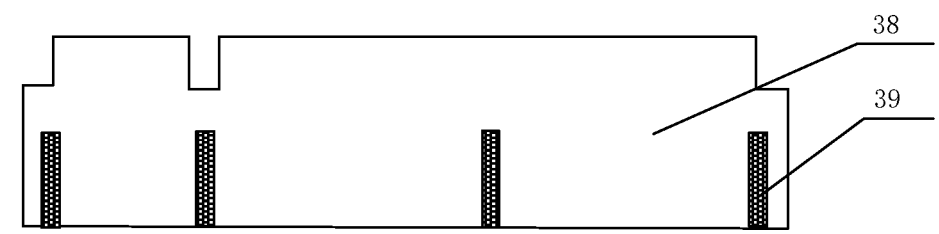
Figure 22:
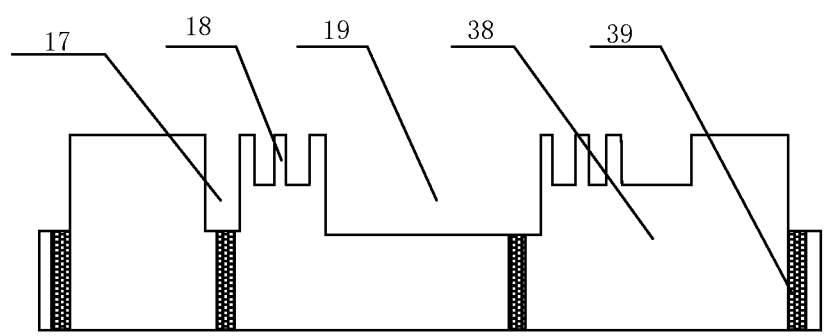
Figure 23:
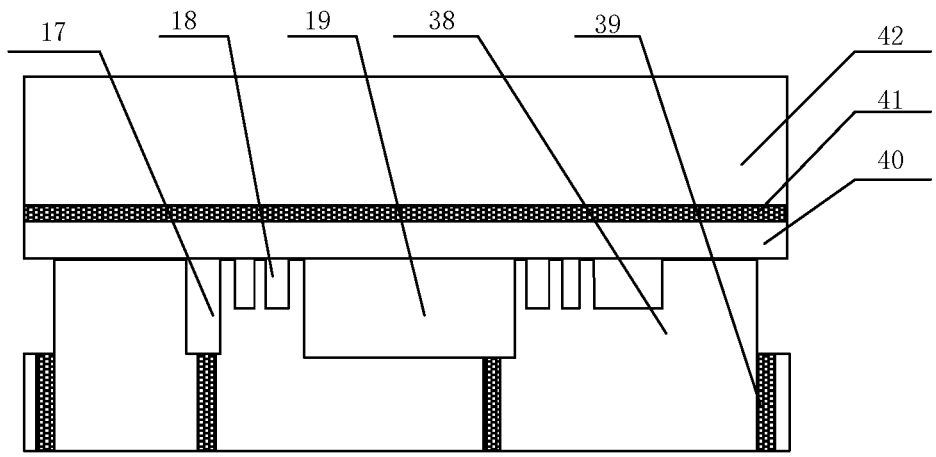
Figure 24:
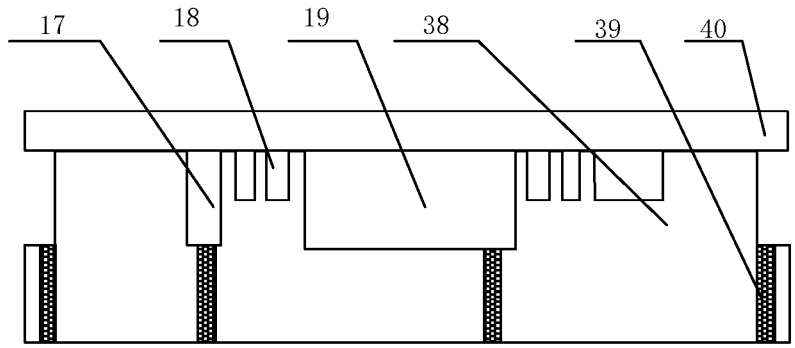
Figure 25:
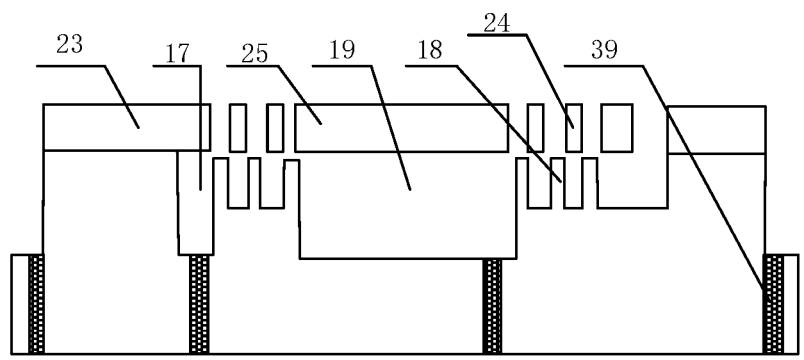
Figure 26:
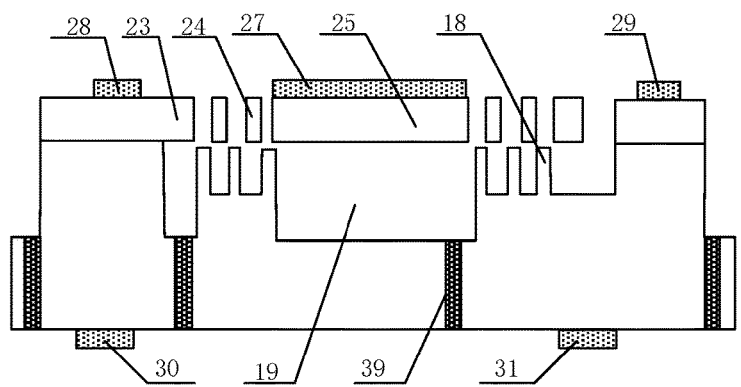

This embodiment provides another method for preparing a MEMS micro mirror with electrodes on both sides, which includes the following steps:

providing a fourth base 38, in which an isolation groove 39 is formed, wherein the isolation groove 39 may be a single groove or a plurality of grooves, and the isolation groove 39 extends along the longitudinal direction of the fourth base 38; specifically, the fourth base 38 includes, but is not limited to, a semiconductor base such as a silicon base, and a photo lithographic etching method can be used to form an isolation opening in the fourth base 38, and the resulting structure is shown in FIG. 19, and then a deposition method or thermal oxidation method can be employed to form insulating material such as silicon oxide in the isolation groove 39, and the resulting structure obtained is shown in FIG. 20. Of course, in other examples, ion implantation can be used to form isolation belts in locations correspond to the isolation groove 39.

forming an insulating groove 17, a moving space groove 19, and a plurality of lower comb plates 18 on the side of the fourth base 38 away from the isolation groove 39 to obtain a pretreatment structure. The insulating groove 17, the moving space groove 19, and the plurality of lower comb plates 18 all extend along the longitudinal direction of the fourth base 38, and the insulating groove 17 and/or the moving space groove 19 are in communication with the isolation groove 39; Specifically, a photo lithographic etching can be used to form an opening corresponding to the insulating groove 17 and define the position of the moving space groove 19, with the insulating groove 17 correspondingly located above the isolation groove 39, to obtain the structure shown in FIG. 21, after which the photo lithographic etching is continued to obtain the insulating groove 17, the moving space groove 19 and a plurality of lower comb plates 18, to obtain the structure shown in FIG. 22.

providing a fifth base, the fifth base comprising a fifth device layer 40, a fifth insulating layer 41, and a fifth substrate layer 42 sequentially stacked, bonding the fifth base to the pretreatment structure, wherein a surface of the moving space groove 19 with the opening and a surface of the fifth device layer 40 are bonding surfaces (the resulting structure is shown in FIG. 23);

removing the fifth substrate layer 42 and the fifth insulating layer 41 (the resulting structure is shown in FIG. 24);

forming a frame 23, upper comb plates 24, a movable micro light reflector 25, and an elastic beam 26 in the fifth device layer 40, with the movable micro light reflector 25 located inside the frame 23, the elastic beam 26 connected to the frame 23 and/or the movable micro light reflector 25, the movable micro light reflector 25 located above the moving space groove 19, projections of the upper comb plates 24 and the lower comb plates 18 on a horizontal plane being staggered (the resulting structure is shown in FIG. 25).

forming a metal reflective layer 27, the first upper comb plate electrode 28, the second upper comb plate electrode 30, the first lower comb plate electrode 29, and the second lower comb plate electrode 31 by methods including but not limited to sputtering, with the metal reflective layer 27 located on a surface of the movable micro light reflector 25, the first upper comb plate electrode 28 and the first lower comb plate electrode 29 located on a surface of the fifth device layer 40, the second upper comb plate electrode 30 and the second lower comb plate electrode 31 located on a surface of the fourth base 38 away from the fifth device layer 40, the first lower comb plate electrode 29 and the second lower comb plate electrode 31 both electrically connected to the lower comb plates 18, the first upper comb plate electrode 28 and the second upper comb plate electrode 30 both electrically connected to the upper comb plates 24 (the resulting structure is shown in FIG. 26)

Figure 27:
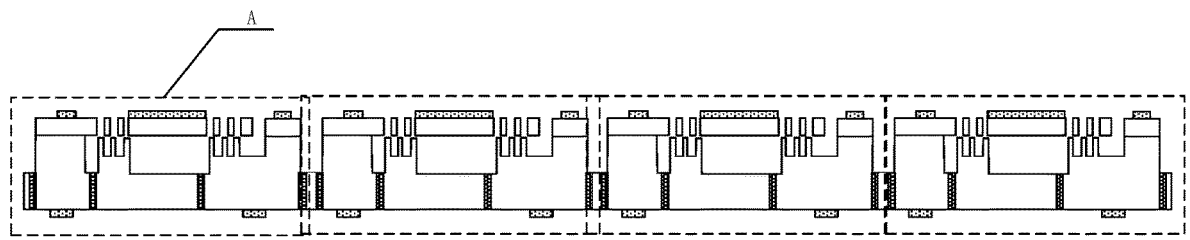

In this embodiment, a single MEMS micro mirror or multiple MEMS micro mirrors can be prepared. When there are multiple MEMS micro mirrors, adjacent MEMS micro mirrors are electrically insulated by the isolation groove 39. FIG. 27 shows a schematic diagram of the structure of a MEMS micro mirror array prepared by the method of this embodiment. Each micro mirror of the MEMS micro mirror array is as shown in FIG. 26. In other words, FIG. 26, in a sense, is an enlarged view of area A of FIG. 27.

Embodiment 5

Figure 28:
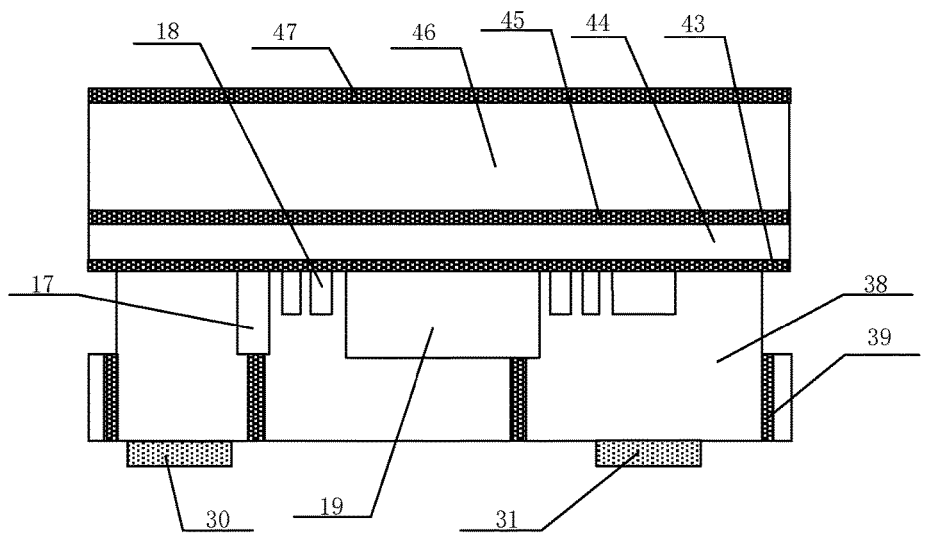
FIGS. 28 and 29 show exemplary cross-sectional views of intermediate structures of a MEMS micro mirror with electrodes on both sides prepared according to the method provided in Embodiment 5 of the present disclosure.
Figure 29:
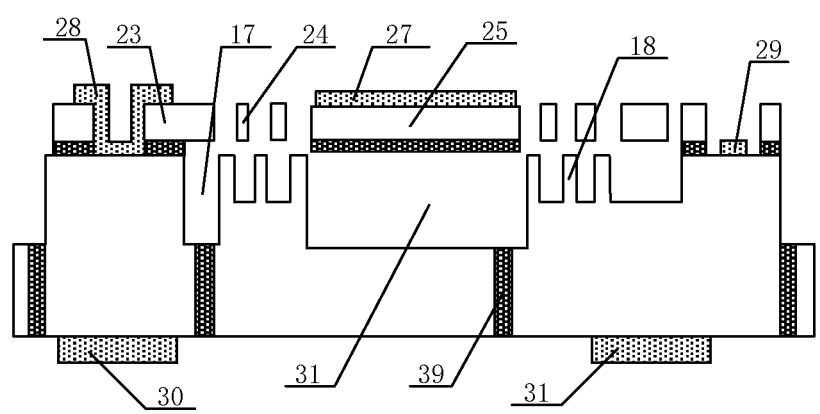

This embodiment provides another method for preparing a MEMS micro mirror with electrodes on both sides. The main difference between the preparation method of this embodiment and Embodiment 4 is that, in Embodiment 4, when the fifth base and the pretreatment structure are bonded, the opening surface of the moving space groove 19 and the surface of the fifth device layer 40 are bonding surfaces; that is, the surfaces of the two semiconductor material layers are bonding surfaces, and each electrode is directly formed on a surface of a corresponding device layer. In this embodiment, a surface of an insulating layer and a surface of a semiconductor material layer are used as bonding surfaces, and electrode lead groove 16 extending to a surface of a device layer are also formed during subsequent etching. Specifically, the method of this embodiment includes the following steps:

providing a fourth base 38, and forming isolation grooves 39 in the fourth base 38, with the isolation grooves 39 extending along a longitudinal direction of the fourth base 38;

forming an insulating groove 17, a moving space groove 19, and a plurality of lower comb plates 18 on the side of the fourth base 38 away from the isolation groove 39 to obtain a pretreatment structure. The insulating groove 17, the moving space groove 19, and the plurality of lower comb plates 18 all extend along a longitudinal direction of the fourth base 38, and the insulating groove 17 and/or the moving space groove 19 are in communication with the isolation groove 39 (see FIGS. 19-22);

forming a second upper comb plate electrode 30 and a second lower comb plate electrode 31 on a surface of the fourth base 38 away from the moving space groove 19;

providing a sixth base, wherein the sixth base comprises a sixth lower protective layer 43, a sixth device layer 44, a sixth insulating layer 45, a sixth substrate layer 46, and a sixth upper protective layer 47 sequentially stacked, wherein the sixth base and the pretreatment structure are bonded, wherein an opening surface of the moving space groove 19 and a surface of the sixth lower protective layer 43 are bonding surfaces (the resulting structure is shown in FIG. 28);

removing the sixth upper protective layer 47, the sixth substrate layer 46, and the sixth insulating layer 45 until the sixth device layer 44 is exposed;

forming a frame 23, upper comb plates 24, a movable micro light reflector 25, elastic beams 26, a first upper comb plate electrode 28 lead groove 16 and a first lower comb plate electrode 29 lead groove 16 in the sixth device layer 44, wherein the movable micro light reflector 25 is located inside the frame 23, the elastic beams 26 are connected with the frame 23 and/or the movable micro light reflector 25, and the movable micro light reflector 25 is located above the moving space groove 19, wherein projections of the upper comb plates 24 and the lower comb plates 18 on a horizontal plane are staggered, wherein the first upper comb plate electrode 28 lead groove 16 and the first lower comb plate electrode 29 lead groove 16 extend along a longitudinal direction of the sixth device layer 44 to a surface of the fourth base 38, wherein the sixth lower protective layer 43 on a surface of the lower comb plates 18 is removed;

forming a metal reflective layer 27, a first upper comb plate electrode 28, a first lower comb plate electrode 29, a second upper comb plate electrode 30, and a second lower comb plate electrode 31, wherein the metal reflective layer 27 is located on a surface of the movable micro light reflector 25, wherein the first upper comb plate electrode 28 is located in the first upper comb plate electrode 28 lead groove 16, and the first upper comb plate electrode 28 extends from the first upper comb plate electrode 28 lead groove 16 to a surface of the sixth device layer 44, and the first lower comb plate electrode 29 is located in the first lower comb plate electrode 29 lead groove 16, wherein the second upper comb plate electrode 30 and the second lower comb plate electrode 31 are located on a surface of the fourth base 38 away from the moving space groove 19, wherein the first lower comb plate electrode 29 and the second lower comb plate electrode 31 are electrically connected to the lower comb plates 18, and the first upper comb plate electrode 28 and the second upper comb plate electrode 30 are electrically connected to the upper comb plates 24 (the resulting structure is shown in the FIG. 29).

In summary, the present disclosure provides a method for preparing a MEMS micro mirror with electrodes on both sides, which includes: providing a first base, wherein the first base comprises a first lower protective layer, a first substrate, a first insulating layer, a first device layer, and a first upper protective layer sequentially stacked; forming an electrode lead groove in the first base, wherein the electrode lead groove extends from the first lower protective layer to a surface of the first device layer; removing the first upper protective layer;

in the first device layer, forming an insulating groove, a plurality of lower comb plates, and a moving space groove to obtain a bonded structure layer, wherein the moving space groove is between the plurality of lower comb plates, and the insulating groove penetrates the first device layer; providing a second base, comprising a second device layer, a second insulating layer, and a second substrate layer sequentially stacked, wherein the second base is bonded to the bonded structure layer to obtain a bonded piece, wherein a surface of the second device layer and a surface of the first device layer are bonded surfaces; removing the second substrate layer and the second insulating layer; in the second device layer forming a frame, a plurality of upper comb plates, a movable micro light reflector and an elastic beam, wherein the movable micro reflector is located inside the frame, the elastic beam is connected to the frame and/or the movable micro light reflector, wherein the movable micro light reflector is located above the moving space groove, wherein projections of the upper comb plates and the lower comb plates on a horizontal plane are staggered;

forming a metal reflective layer, a first upper comb plate electrode, a first lower comb plate electrode, a second upper comb plate electrode, and a second lower comb plate electrode, wherein the first upper comb plate electrode and the first lower comb plate electrode are located on a surface of the frame, and the second upper comb plate electrode and second lower comb plate electrode are located in the electrode lead groove, wherein the first lower comb plate electrode and second lower comb plate electrode are electrically connected to the lower comb plates, and the first upper comb plate electrode and the second upper comb plate electrode are electrically connected to the upper comb plates. In the present disclosure, electrodes are arranged on the upper and lower sides of the MEMS micro mirror, and the probe and test system can be easily built on the chip during testing. Therefore, conventional test methods can be used without customized test equipment since the electrodes can still be led out from below when packaged, which can greatly improve testing and packaging flexibility of the chip. The advantages of the invention are particularly prominent when it is used to prepare a MEMS micro mirror array. Therefore, the present disclosure effectively overcomes various shortcomings of the prior art and has a high industrial value.

The above-mentioned embodiments only exemplarily illustrate the principles and effects of the present disclosure, and are not used to limit the present disclosure. Anyone familiar with this technology can modify or change the above-mentioned embodiments without departing from the spirit and scope of the present disclosure. Therefore, all equivalent modifications or changes made by those skilled in the art without departing from the spirit and technical concepts disclosed by the present disclosure should still be covered by the attached claims of the present disclosure.

What is claimed is:

1. A method for preparing a micro electromechanical system (MEMS) micro mirror with electrodes on both sides, comprising:

providing a first base, wherein the first base comprises a first lower protective layer, a first substrate, a first insulating layer, a first device layer, and a first upper protective layer sequentially stacked; forming an electrode lead groove in the first base, wherein the electrode lead groove extends from the first lower protective layer to a surface of the first device layer;

removing the first upper protective layer;

in the first device layer, forming an insulating groove, a plurality of lower comb plates, and a moving space groove to obtain a bonded structure layer, wherein the moving space groove is between the plurality of lower comb plates, and the insulating groove penetrates the first device layer;

providing a second base, comprising a second device layer, a second insulating layer, and a second substrate layer sequentially stacked, wherein the second base is bonded to the bonded structure layer to obtain a bonded piece, wherein a surface of the second device layer and a surface of the first device layer are bonding surfaces;

removing the second substrate layer and the second insulating layer; in the second device layer, forming a frame, a plurality of upper comb plates, a movable micro light reflector, and an elastic beam, wherein the movable micro light reflector is located inside the frame, the elastic beam is connected to the frame and/or the movable micro light reflector, wherein the movable micro light reflector is located above the moving space groove, wherein projections of the upper comb plates and the lower comb plates on a horizontal plane are staggered;

forming a metal reflective layer, a first upper comb plate electrode, a first lower comb plate electrode, a second upper comb plate electrode, and a second lower comb plate electrode, wherein the first upper comb plate electrode and the first lower comb plate electrode are located on a surface of the frame, and the second upper comb plate electrode and the second lower comb plate electrode extend from the electrode lead groove to the surface of the first substrate, wherein the first lower comb plate electrode and the second lower comb plate electrode are electrically connected to the lower comb plates, and the first upper comb plate electrode and the second upper comb plate electrode are electrically connected to the upper comb plates.

2. The method for preparing a MEMS micro mirror with electrodes on both sides according to claim 1, wherein the first base and the second base both comprise a silicon-on-insulator (SOI) substrate.

3. The method for preparing a MEMS micro mirror with electrodes on both sides according to claim 1, wherein a cross section of the electrode lead groove is a trapezoid, and the forming of the electrode lead groove comprises: etching the first lower protective layer and the first substrate to form a first opening, and then removing the first insulating layer corresponding to the first opening to form the electrode lead groove exposing the first device layer.

4. The method for preparing a MEMS micro mirror with electrodes on both sides according to claim 1, wherein a cross section of the electrode lead groove is a rectangle, and the forming of the electrode lead groove comprises removing the first lower protective layer and the first upper protective layer, and then etching the first substrate and the first insulating layer in one etching process, to form the electrode lead groove exposing the first device layer, wherein during the forming of the electrode lead groove, the insulating groove penetrating the first substrate is formed in the first substrate.

5. A method for preparing a micro electromechanical system (MEMS) micro mirror with electrodes on both sides, comprising:

providing a first base, wherein the first base comprises a first lower protective layer, a first substrate, a first insulating layer, a first device layer, and a first upper protective layer sequentially stacked; in the first base, forming a lower lead groove which extends from the first lower protective layer to a surface of the first device layer;

removing the first upper protective layer;

in the first device layer, forming an insulating groove, a plurality of lower comb plates, an upper lead groove, and a moving space groove to obtain a bonded structure layer, wherein the moving space groove is between the plurality of lower comb plates, the upper lead groove and the insulating groove penetrate the first device layer, and the upper lead groove and the lower lead groove are connected and form an electrode lead groove;

providing a third base, wherein the third base comprises a third lower protective layer, a third device layer, a third insulating layer, a third substrate layer, and a third upper protective layer sequentially stacked, wherein the third base and the bonded structure layer is bonded to obtain a bonded piece, wherein a surface of the third lower protective layer of the third base and a surface of the first device layer are bonding surfaces;

removing the third upper protective layer, the third substrate layer, and the third insulating layer, forming a frame, upper comb plates, a movable micro light reflector, an elastic beam and a lower comb plate electrode lead groove in the third device layer, wherein the movable micro light reflector is located inside the frame, the elastic beams are is connected to the frame and/or the movable micro light reflector, the movable micro light reflector is above the moving space groove, the lower comb plate electrode lead groove penetrates the third device layer and extends down to a surface of the first device layer, and projections of the upper comb plates and the lower comb plates on a horizontal plane are staggered;

forming a metal reflective layer, a first upper comb plate electrode, a first lower comb plate electrode, a second upper comb plate electrode, and a second lower comb plate electrode, wherein the first upper comb plate electrode is located on a surface of the frame, and the first lower comb plate electrode is located inside the lower comb plates electrode lead groove, wherein the second upper comb plate electrode and the second lower comb plate electrode extend from the electrode lead groove to a surface of the first substrate, wherein the first lower comb plate electrode and the second lower comb plate electrode are electrically connected with the lower comb plates, and the first upper comb plate electrode and the second upper comb plate electrode are electrically connected with the upper comb plates.

6. A method for preparing a micro electromechanical system (MEMS) micro mirror with electrodes on both sides, comprising:
providing a fourth base, and forming isolation grooves in the fourth base, with the isolation grooves extending along a longitudinal direction of the fourth base;
forming an insulating groove, a moving space groove, and a plurality of lower comb plates on a side of the fourth base away from the isolation grooves to obtain a pretreatment structure, and the insulating groove, the moving space groove, and the plurality of lower comb plates all extend along the longitudinal direction of the fourth base, wherein the insulating groove and/or the moving space groove are connected with the isolation grooves;
providing a fifth base, wherein the fifth base comprises a fifth device layer, a fifth insulating layer, and a fifth substrate layer sequentially stacked, the fifth base and the pretreatment structure are bonded together, and an opening surface of the moving space groove and a surface of the fifth device layer are bonding surfaces;
removing the fifth substrate layer and the fifth insulating layer;
in the fifth device layer, forming a frame, a plurality of upper comb plates, a movable micro light reflector, and an elastic beam, wherein the movable micro light reflector is located inside the frame, the elastic beam is connected to the frame and/or the movable micro light reflector, wherein the movable micro light reflector is located above the moving space groove, wherein projections of the upper comb plates and the lower comb plates on a horizontal plane are staggered; and forming a metal reflective layer, a first upper comb plate electrode, a second upper comb plate electrode, a first lower comb plate electrode, and a second lower comb plate electrode, wherein the metal reflective layer is located on a surface of the movable micro light reflector, the first upper comb plate electrode and the first lower comb plate electrode are located on a surface of the fifth device layer, and the second upper comb plate electrode and the second lower comb plate electrode are located on a surface of the fourth base away from the fifth device layer, wherein the first lower comb plate electrode and the second lower comb plate electrode are electrically connected with the lower comb plates, and the first upper comb plate electrode and the second upper comb plate electrode are electrically connected with the upper comb plates.

7. The method for preparing a MEMS micro mirror with electrodes on both sides according to claim 6, wherein there are multiple MEMS micro mirrors, and adjacent MEMS micro mirrors are electrically insulated by the isolation grooves.

8. The method for preparing a MEMS micro mirror with electrodes on both sides according to claim 6, wherein the forming of the isolation grooves comprises: first forming a plurality of isolation openings in the fourth base, and filling insulating material in the isolation openings to form the isolation grooves.

9. A method for preparing a MEMS micro mirror with electrodes on both sides structure, comprising:
providing a fourth base, and forming isolation grooves in the fourth base, with the isolation grooves extending along a longitudinal direction of the fourth base;
forming an insulating groove, a moving space groove, and a plurality of lower comb plates on a side of the fourth base away from the isolation grooves to obtain a pretreatment structure, and the insulating groove, the moving space groove, and the plurality of lower comb plates all extend along the longitudinal direction of the fourth base, wherein the insulating groove and/or the moving space groove are connected with the isolation grooves;
providing a sixth base, wherein the sixth base comprises a sixth lower protective layer, a sixth device layer, a sixth insulating layer, a sixth substrate layer, and a sixth upper protective layer sequentially stacked, wherein the sixth base and the pretreatment structure are bonded, wherein an opening surface of the moving space groove and a surface of the sixth lower protective layer are bonding surfaces;
removing the sixth upper protective layer, the sixth substrate layer, and the sixth insulating layer until the sixth device layer is exposed;
forming a frame, upper comb plates, a movable micro light reflector, an elastic beams, a first upper comb plate electrode lead groove and a first lower comb plate electrode lead groove in the sixth device layer, wherein the movable micro light reflector is located inside the frame, the elastic beams is connected with the frame and/or the movable micro light reflector, and the movable micro light reflector is located above the moving space groove, wherein projections of the upper comb plates and the lower comb plates on a horizontal plane are staggered, wherein the first upper comb plate electrode lead groove and the first lower comb plate electrode lead groove extend along a longitudinal direction of the sixth device layer to a surface of the fourth base; and forming a metal reflective layer, a first upper comb plate electrode, a first lower comb plate electrode, a second upper comb plate electrode, and a second lower comb plate electrode, wherein the metal reflective layer is located on a surface of the movable micro light reflector, wherein the first upper comb plate electrode extends from the first upper comb plate electrode lead groove to a surface of the sixth device layer, and the first lower comb plate electrode is located in the first lower comb plate electrode lead groove, wherein the second upper comb plate electrode and the second lower comb plate electrode are located on a surface of the fourth base away from the moving space groove, wherein the first lower comb plate electrode and the second lower comb plate electrode are electrically connected to the lower comb plates, and the first upper comb plate electrode and the second upper comb plate electrode are electrically connected to the upper comb plates.

10. The method for preparing a MEMS micro mirror with electrodes on both sides according to claim 9, wherein the first upper comb plate electrode extends from the first upper comb plate electrode lead groove to a surface of the sixth device layer.

* * * * *